June 2, 1959

A. P. STERN 2,889,453

TUNABLE TRANSISTOR RADIO FREQUENCY AMPLIFIER
HAVING APPROXIMATELY CONSTANT BANDWIDTH

Filed May 31, 1955

PRIOR ART

INVENTOR:
ARTHUR P. STERN,

BY George V. Eltgroth

HIS ATTORNEY.

United States Patent Office 2,889,453

Patented June 2, 1959

2,889,453

TUNABLE TRANSISTOR RADIO FREQUENCY AMPLIFIER HAVING APPROXIMATELY CONSTANT BANDWIDTH

Arthur P. Stern, Syracuse, N.Y., assignor to General Electric Company, a corporation of New York Application May 31, 1955, Serial No. 511,847

3 Claims. (Cl. 250—20)

The present invention relates to amplifier systems for amplification of waves of radio frequency and has as a particular object thereof the provision of an improved transistor amplifier adapted to be tuned over a relatively wide range of frequencies.

Semiconductor devices are generally not well adapted for use in vacuum tube amplifier circuits. This is particularly true in the tuned radio frequency circuits of broadcast band receivers in which the amplifier is tuned over a frequency range of from 530 to 1620 kilocycles. When a transistor device is employed in an essentially unmodified vacuum tube circuit, the bandwidth of the amplifier may well vary by the square of the frequency range (typically 9 to 1) or more, a variation many times that of the same circuit employing a vacuum tube.

This disparity arises from fundamental differences in the nature of the operation of transistor devices and vacuum tube devices. In the usual low and medium radio frequency vacuum tube circuits the voltage transfer ratio of the coupling networks is most important, whereas the power transfer is of minor concern. In such circuits the vacuum tube presents negligible loading to the tank circuit feeding it. The bandwith of the circuit consequently is established primarily by the inherent Q of the tank circuit. Careful design of the tank circuit usually makes it possible to maintain substantially the same bandwidth throughout the frequency range. When a transistor is employed, however, the transistor being essentially a power amplifying device absorbing appreciable input power, it is necessary to optimize the power transfer. This requirement dictates that the transistor provide substantial loading to the tuned circuit. Consequently the overall selectivity is determined mainly by the resistive component of the transistor impedance rather than by the loss resistance of the coil. Assuming that the resistive component of the transistor impedance is constant, calculation further shows that the bandwidth of the circuit is not fixed, but may well vary over the range og 9 to 1 or more, as indicated above. Furthermore, as will be indicated subsequently, the resistive component of the transistor input impedance is not precisely constant with respect to the applied frequency and hence requires a slightly more complex compensation. Accordingly, an object of the present invention is to provide a novel variably tuned amplifier circuit in which the gross change in bandwith is compensated as well as the somewhat more subtle effect on bandwidth occasioned by changes in the transistor input resistance with frequency.

It is another object of the present invention to provide an improved tuned radio frequency amplifier employing a transistor adapted to be tuned over a relatively wide range of frequencies, wherein the selectivity of the amplifier is maintained relatively high.

It is still another object of the present invention to provide an improved tuned radio frequency amplifier employing a transistor adapted to be tuned over a relatively wide range of frequencies, wherein the selectivity of the amplifier is maintained substantially constant.

It is a further object of the present invention to provide an improved antenna input radio frequency amplifier employing a transistor amplifying device wherein the bandwidth of the amplifier is maintained substantially constant with respect to the tuned frequency.

These and other objects are achieved in a novel transistor amplifier adapted to be tuned over a band of frequencies. In accordance with the present invention, a transistor is employed, connected in a grounded emitter configuration. A novel frequency selective transfer network adapted to be tuned over said band is associated with said transistor, the frequency transfer network being essentially of the series resonant type in that it exhibits an impedance minimum at the tuned frequency. When this type of input circuit is employed with a transistor, in which the input resistance decreases with frequency, a relatively constant amplifier bandwidth may be achieved throughout a wide band of frequencies. In accordance with further teaching of the invention, optimum points of adjustment are further suggested for minimizing the variation of bandwidth with frequency.

The features characterizing the invention are pointed out with particularity in the appended claims. The details of the invention, together with further objects and advantages thereof will best be understood by reference to the following specification when taken in connection with the appended drawings in which:

Figure 2(*b*) is an equivalent circuit of a tuned radio frequency amplifier in accordance with the invention;

Figure 1:
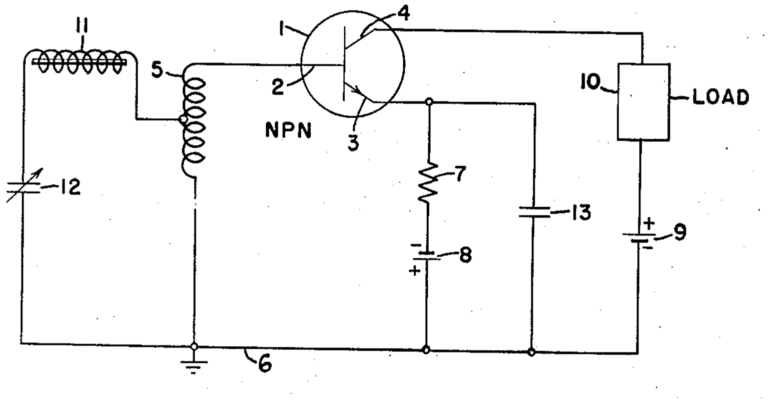
Figure 1 is a radio frequency amplifier directly coupled to an antenna.

The circuit shown in Figure 1 is that of a radio frequency amplifier suitable for use as the antenna input amplifier of a broadcast band receiver. At 1 is shown a transistor of the n-p-n type having a base electrode 2, an emitter electrode 3 and a collector electrode 4. The base electrode 2 is connected through a radio frequency autotransformer 5 to a ground bus 6. Emitter bias is provided by a resistance 7 and a source of direct potentials 8, the positive terminal of the source 8 being connected to the ground bus 6 and the negative terminal of the source 8 being connected through resistance 7 to the emitter 3. Energization of the collector electrode 4 is provided by a second source of direct potentials 9 having its negative terminal connected to the bus 6 and its positive terminal connected to a load 10 which is connected at its other terminal to the collector 4. The load device 10 provides a conductive path between the collector electrode 4 and the source 9 for direct current energization of the collector electrode.

As illustrated, the amplifier shown in Figure 1 is a radio frequency amplifier connected in grounded emitter configuration. Radio frequency signals are received in a ferrite cored loop antenna 11 which has one terminal connected to a tuning capacitor 12. The other terminal of the tuning capacitor 12 is connected to the ground bus 6. The other terminal of the ferrite loop antenna 11 is connected to a tap on the autotransformer 5, which, as mentioned before, is coupled to the base electrode 2. The emitter electrode 3 is coupled by a capacitor 13 to the ground bus 6.

When radio frequency signals of appropriate frequency are picked up in the ferrite loop antenna 11, the series resonant circuit comprising the loop antenna 11 and the tuning capacitance 12, transfers the selected signals to the input of the auto transformer 5. The frequency of series resonance and hence the frequencies of the selected signals are primarily determined by the values of inductance of the antenna 11 and the capacitance 12 since the autotransformer exhibits essentially a resistive load to the supply circuit. The secondary currents in the autotransformer 5 are then applied to the base electrode 2. The position of the tap of the autotransformer 5 is such as to provide proper matching between the antenna circuit and the input of the transistor 1 preferably for optimum power transfer. The step-up ratio is of the order of 10 to 1. The capacitance 13 is chosen to have a sufficiently high capacity to effectively ground the emitter electrode 3 for applied radio frequency potentials. This value may be on the order of .01 microfarad at broadcast band frequencies. The load device 10 may be the input circuit of a following amplifier, or other utilization means.

The radio frequency amplifier just described has an extremely constant bandwidth over the conventional broadcast band range of 530 kc. to 1620 kc. In the embodiment shown, the ratio of the bandwidths at the upper and lower ends of the band is reduced from a normal value of from 5 to 1 or more to a ratio of from approximately 0.9 to 1 through 2 to 1, depending upon the frequency point at which perfect power transfer is effected. With a given antenna circuit Q, and a given transistor input resistance, if the transformer transfer ratio is chosen to provide optimum power transfer at the high frequency end of the broadcast band, it has been observed that at the low frequency end of the broadcast band almost perfect bandwidth compensation is achieved, and the variation in bandwidth throughout the band is likewise correspondingly reduced.

Figure 2A:
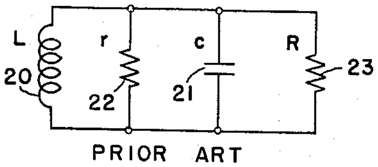
Figure 2(*a*) is an equivalent circuit of a known tuned radio frequency amplifier.
Figure 2A:
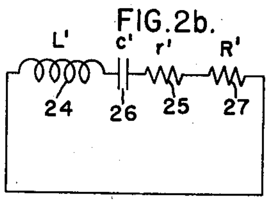

The manner in which the bandwidth is stabilized may be explained by resort to an equivalent representation of the transistor amplifier input circuit. Figure 2(*a*) shows an equivalent circuit by which a transistor amplifier having a parallel resonant input tank circuit may be represented, while Figure 2(*b*) shows an equivalent circuit for a transistor amplifier having a series resonant input tank circuit in accordance with the present invention.

The equivalent circuit shown in Figure 2(*a*) comprises an inductance 20, shunted by a capacitance 21, a resistance 22, and a second resistance 23. The inductance 20 is contained principally in the inductance coil of the tank circuit. The capacitance 21 is formed principally of the capacitance furnished by the capacitor of the tank circuit but also contains the stray capacitance present in the circuit including that contributed by the transistor itself. The resistance 22 symbolizes the losses of the inductance coil of the tank circuit and the leads associated with the tank circuit, while the resistance 23 represents the transistor input resistance alone. The source of energy to which each of these elements are connected has not been shown and can be coupled into the circuit in any of several known ways including that shown in Figure 1.

It has been determined experimentally that the input resistance 23 of a transistor connected in grounded emitter configuration decreases with increasing frequency. If the transistor input resistance is plotted against frequency, the curve is slightly concave upward at higher frequencies. The limits of the range of higher frequencies are determined by the characteristics of the particular transistor type under consideration. Most current transistors exhibit this behaviour throughout the range of 530 to 1620 kilocycles per second. This arises from the fact that the input resistance of the transistor may be treated as a composite impedance comprising a first resistance (the so-called "base spreading resistance") connected in series with the parallel combination of a second resistance and a capacitance (the "emitter diffusion capacitance"). Since this capacitance effectively shunts the second resistance the resultant input resistance becomes frequency dependent. The frequency dependence of the transistor input resistance can be represented by a mathematical relationship which can be approximated within a limited frequency range by:

$$R=Kw^n \qquad (1)$$

where R represents the transistor input resistance, $w$ is the frequency in radians per second and $n$ and K are constants chosen in a manner to provide optimum match of the R versus frequency curve in the frequency range considered. It has been found experimentally, that with many transistors in the frequency range from 530 to 1620 kc., $$n=-\tfrac{1}{2} \qquad (2)$$

Consequently the transistor input resistance can be represented with sufficient accuracy as $$R=\frac{K}{\sqrt{w}} \qquad (3)$$

The circuit shown in Figure 2(*a*) may then be said to have an operating Q or inverse relative bandwidth, in the region of anti-resonance as follows:

$$Q=\frac{w}{\Delta w}=\frac{rR/(r+R)}{wL} \qquad (4)$$

where $r$ represents the resistance 22,
L represents the inductance 20, and
$\Delta w$ the bandwidth at $w$.

If we now define $Q_0$ as the Q of the resonant circuit without transistor loading:

$$Q_0=\frac{r}{wL};\ r=wLQ_0 \qquad (5)$$

and substitute the relations for $r$ in Expression 5 and for R in Expression 3 into Expression 4 we find:

$$Q=\frac{w}{\Delta w}=\frac{(wLQ_0K/\sqrt{w})/(wLQ_0+K/\sqrt{w})}{wL} \qquad (6)$$

and $$\Delta w=\frac{w^{5/2}LQ_0+Kw}{Q_0K} \qquad (7)$$

Defining, $$K=w_0^{3/2}LQ_0 \qquad (8)$$

where $w_0$ is as yet an undefined frequency, and substituting for K in 7

$$\Delta w=\frac{w^{5/2}+w(w_0^{3/2})}{Q_0w_0^{3/2}} \qquad (9)$$

We finally obtain the following expression for the bandwidth:

$$\Delta w=\frac{w}{Q_0}\left[\left(\frac{w}{w_0}\right)^{3/2}+1\right] \qquad (10)$$

Making $w=w_0$, one finds that $$\frac{w}{\Delta w}=\frac{Q_0}{2}$$

and consequently $w_0$ is the frequency of optimum power transfer.

The magnitude of the change in bandwidth as one tunes through a frequency range of 3 to 1, may be obtained from Equation 10. If the upper frequency limit of the tuned amplifier is designated by $w_2$ and the lower frequency limit by $w_1$ and if, furthermore, $\Delta w_2$ represents the bandwidth at $w_2$ and $\Delta w_1$ the bandwidth at $w_1$, then the ratio $$\frac{\Delta w_2}{\Delta w_1}$$

indicates the relative change in bandwidth between the amplifier as tuned to $w_1$, and as tuned to $w_2$, the opposite ends of the frequency range from $w_1$ to $w_2$:

$$\frac{\Delta w_2}{\Delta w_1}=\frac{w_2}{w_1}\left[\frac{1+\left(\frac{w_2}{w_0}\right)^{3/2}}{1+\left(\frac{w_1}{w_0}\right)^{3/2}}\right] \quad (11)$$

If now one provides maximum power transfer at the upper frequency limit $w_2$ of the amplifier, i. e. sets $w_0$ equal to $w_2$, the bandwidth ratio becomes:

$$\frac{\Delta w_2}{\Delta w_1}=3\left[\frac{2}{1+1/5}\right]=\frac{6}{1.2}=5 \quad (12)$$

But if maximum power transfer is provided at the lower frequency limit $w_1$, then $w_1=w_0$ and we obtain a somewhat worse bandwidth ratio:

$$\frac{\Delta w_2}{\Delta w_1}=3\left[\frac{1+5.2}{2}\right]=\frac{18.2}{2}=9.1 \quad (13)$$

When we compare the change in bandwidth occurring using a parallel resonant circuit with the change occurring using a series resonant circuit we find that the latter shows greater constancy in bandwidth. Figure 2(*b*) illustrates an equivalent circuit of the transistor amplifier input circuit in which a series resonant type of input circuit is employed. Here the inductance is represented at 24, the circuit resistance at 25, the tuning capacity at 26 and the transistor input resistance at 27. These impedances are shown connected in series with one another. The source of electrical energy is not shown. If one now wishes to obtain an expression for the bandwidth corresponding to Expression 10, one may employ the same technique used in deriving Expression 10. The Q may be expressed as:

$$Q=\frac{wL'}{r'+R'} \quad (14)$$

where $w$, $L'$, $r'$ and $R'$ are defined respectively as the frequency in radians, the inductance 24, the resistance 25, and the transistor input resistance 27. Substituting for $r'$, and $R'$, we obtain $$Q=\frac{wL'}{wL'/Q_0+K'/\sqrt{w}} \quad (15)$$

Defining $$K'=w_0^{3/2}L'/Q_0 \text{ at } w_0 \quad (16)$$

and substituting, we find $$\Delta w=\frac{1}{Q_0}\left[w+\frac{w_0^{3/2}}{w^{1/2}}\right] \quad (17)$$

and that $w_0$ is again the frequency of maximum power transfer. The ratio $\Delta w_2/\Delta w_1$ may then be represented as follows:

$$\frac{\Delta w_2}{\Delta w_1}=\frac{w_2+\frac{w_0^{3/2}}{w_2^{1/2}}}{w_1+\frac{w_0^{3/2}}{w_1^{1/2}}} \quad (18)$$

If one now sets the upper frequency $w_2$ equal to $w_0$, the frequency of maximum power transfer, we now obtain $$\frac{\Delta w_2}{\Delta w_1}=3\frac{(1+1)}{1+5.2}=\frac{6}{6.2}=0.97 \quad (19)$$

The change in bandwidth is thus much less than the corresponding change obtained in Expression 12. If one selects the lower frequency limit $w_1=w_0$ as the frequency of maximum power transfer, one obtains a value of 1.8 for the bandwidth ratio, a value still much better than the 9.1 obtained in Expression 13. The gain of a transistor amplifier decreases with increasing frequency. Consequently in the majority of cases one will want to provide maximum power transfer at the upper frequency limit $w_2$.

From the above it may be seen that the bandwidth is notably stabilized by applicant's novel arrangement, and further that the constancy is greatly enhanced by adjusting the circuit constants to present the optimum power transfer at or near the upper frequency limit of the tuning range.

Figure 3:
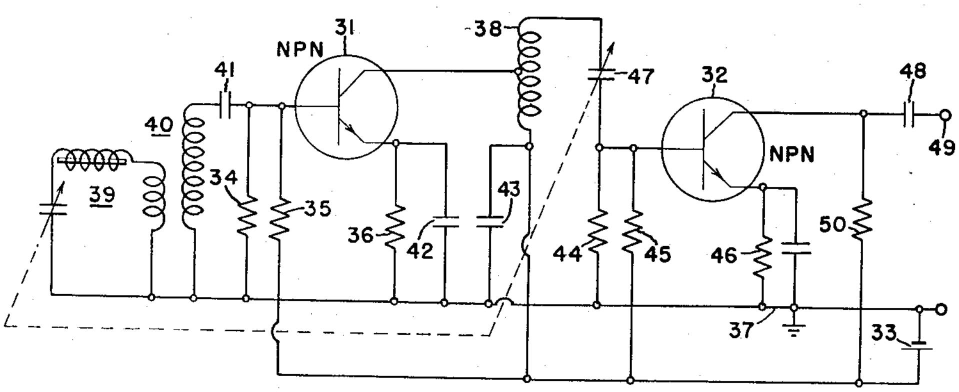
Figure 3 is a multiple stage radio frequency amplifier wherein the second radio frequency amplification stage also incorporates the invention.

Figure 3 is an illustration of a two stage radio frequency amplifier adapted to be tuned over the broadcast band. The amplifier employs two transistors of the n-p-n type 31 and 32. The first transistor is coupled into the antenna circuit of the receiver, in a circuit which may have the same properties as those shown in Figure 1. The direct current energization of the transistor 31 is provided by the source 33. Base energization is provided by a pair of resistances 34 and 35 coupled in series across the source 33 and having their common terminal connected to the base electrode of transistor 31. The emitter bias is established by resistance 36 coupled between the emitter electrode and the ground bus 37. The collector electrode of transistor 31 is connected to an output autotransformer 38 at the tap thereof. The end terminal of the autotransformer 38 which is connected to the positive terminal of source 33 provides energization for the collector electrode.

Radio frequency signals are coupled to the transistor 31 by means of a series tuned input circuit shown at 39 coupled through a step-up radio frequency transformer 40 to the base connected input capacitor 41. The emitter is connected through a capacitor 42, which has a low impedance with respect to applied frequencies, to ground. The output of the amplifier appears at the collector electrode and is applied across the tap and positive source connected terminal of the autotransformer 38. The last mentioned output transformer terminal is also coupled through a bypass capacitor 43 to the ground bus 37.

The transistor 32 and its associated circuitry form a second stage of radio frequency amplification. The energization of the transistor 32 is also provided by the source 33 and resistors 44, 45 and 46. The resistors 44 and 45 are coupled in series across the source 33. The base electrode of transistor 32 is connected to their common terminal. The emitter electrode of transistor 32 is coupled through resistance 46 to the ground bus 37. The end terminal of the auto transformer 38 remote from the terminal connected to the source 33 is coupled through a tuning capacitor 47 to the base electrode of transistor 32. Capacitor 47 and the autotransformer provide a series resonant coupling circuit between the amplifier stages. The collector of transistor 32 is coupled through an output capacitor 48 to output terminal 49. Energization of the collector is provided through a resistance 50 coupled to the positive terminal of source 33.

The two stage amplifier may incorporate in either or both of the two stages the measures which are the subject of the present invention. As illustrated, the antenna input circuit 39 employed in Figure 3 is essentially a series resonant input circuit. Accordingly, it stabilizes the bandwidth of the first amplification stage. Similarly, the input circuit for the transistor 32 which comprises autotransformer 38 and tuning capacitor 37 is also a series resonant circuit as far as the input resistance of transistor 32 is concerned which likewise stabilizes the bandwidth of the second stage. Since, however, the output resistance of transistor 31 is in parallel with the tuned circuit, the improvement in bandwidth variation will not be quite as good as in the case of the antenna circuit previously discussed. The optimum adjustments discussed in connection with the embodiment of Figure 1 also apply to both stages of the embodiment shown in Figure 1.

While n-p-n type transistors have been disclosed, the circuits herein treated are also applicable to p-n-p type transistors, as well as to four electrode semiconductor devices.

While particular embodiments of this invention have been shown and described, it will, of course, be apparent that various modifications may be made without departing from the invention. Therefore, by the appended claims it is intended to cover all such changes and modifications as fall within the true spirit and scope of the present invention.

I claim:

1. In a tuned radio frequency amplifier adapted to be operatively tuned over a band of frequencies and to supply an output signal of substantially constant signal bandwidth throughout said band, comprising a transistor having a base and emitter electrodes, wherein said transistor exhibits an input resistance between said base and emitter electrodes which decreases with frequency over said band, a source of radio frequency signals which lie within said band of frequencies, and a tunable frequency selective signal transfer network for tuning said amplifier over said band of frequency, said network comprising an inductance and a variable capacitance serially connected so as to form a series resonant circuit which exhibits an impedance minimum at the tuned frequency, means for applying radio frequency signals to said network, means for coupling said network to the base and emitter electrodes of said transistor, said means being constructed so that the series loss resistance of said network is matched to said transistor input resistance and maximum power transfer occurs at the upper portion of said band of frequencies.

2. In a tuned radio frequency amplifier adapted to be tuned over a band of frequencies, means for maintaining a substantially constant signal bandwidth throughout said band comprising a transistor having base and emitter electrodes, said transistor being connected in grounded emitter configuration and exhibiting an input resistance between said base and emitter electrodes which decreases with frequency over said band, a source of radio frequency signals which lie within said band of frequencies, and a tunable frequency selective signal transfer network for coupling waves from said source to said transistor comprising an inductance and a capacitance connected in series to form a series resonant input circuit, a step-up transformer having input and output terminals and constructed to provide optimum power transfer from said source to said transistor at the upper portion of said band of frequencies, means connecting said input terminals across said frequency selective network and means connecting said output terminals to the base and emitter electrodes of said transistor whereby the series loss resistance of said transfer network is matched to the input resistance of said transistor.

3. In an antenna input radio frequency amplifier constructed to be tuned over a band of frequencies and providing an output signal of substantially constant bandwidth, the combination comprising a transistor having a base and an emitter electrode, said transistor being connected in grounded emitter configuration wherein said transistor exhibits an input resistance between said emitter and base electrodes which decreases with frequency over said band, an antenna input circuit comprising a loop antenna, a variable resonating capacitance and a step-up transformer having input and output terminals, said loop antenna and said capacitance being connected in series between the input terminals of said step-up transformer, said series connected antenna and capacitance forming a series resonant circuit tunable over said band of frequencies, means connecting the output terminals of said step-up transformer to the base and emitter electrodes of said transistor, said step-up transformer having a step-up ratio selected to provide optimum power transfer from said loop antenna to said transistor at the upper portion of said band of frequencies and substantially matching the series resonant loss resistance of said series resonant circuit to the input resistance of said transistor.

References Cited in the file of this patent

UNITED STATES PATENTS

| | | |
|---|---|---|
| 1,664,192 | Conrad | Mar. 27, 1928 |
| 2,267,173 | Schaper | Dec. 23, 1941 |
| 2,511,327 | Bussard | June 13, 1950 |
| 2,596,687 | Pan | Oct. 2, 1951 |
| 2,641,704 | Stott | June 9, 1953 |
| 2,647,957 | Mallinckrodt | Aug. 4, 1953 |

FOREIGN PATENTS

| | | |
|---|---|---|
| 164,243 | Australia | Apr. 8, 1954 |
| 454,346 | Great Britain | Sept. 29, 1936 |

OTHER REFERENCES

"An Experimental . . . Receiver," By Barton, IRE Prof. Group on BC and TV Receivers, January 1954.

"High Frequency Transistor Amplifiers," by Chow, Electronics, April 1954. Only page 143 cited.

"Principles of Transistor Circuits," by Shea, pp. 234, 235, 1953.

"Transistor Broadcast Receivers," by Stern and Raper, revised text of paper presented to IRE National Convention in March 1954. AIEE Journal December 1954, pages 1107–1112. Only page 1108 cited.